(12) United States Patent
Sato et al.

(10) Patent No.: US 8,766,311 B2
(45) Date of Patent: Jul. 1, 2014

(54) SEMICONDUCTOR LIGHT EMITTING DEVICE AND LIGHT EMITTING APPARATUS

(75) Inventors: Taisuke Sato, Kanagawa-ken (JP); Shigeya Kimura, Kanagawa-ken (JP); Kotaro Zaima, Tokyo (JP); Koichi Tachibana, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 13/206,649

(22) Filed: Aug. 10, 2011

(65) Prior Publication Data

US 2012/0217524 A1    Aug. 30, 2012

(30) Foreign Application Priority Data

Feb. 24, 2011    (JP) ................................. 2011-038311

(51) Int. Cl.
*H01L 33/00* (2010.01)
*H01L 33/20* (2010.01)
*H01L 33/38* (2010.01)
*H01L 33/44* (2010.01)
*H01L 33/40* (2010.01)

(52) U.S. Cl.
CPC ............... *H01L 33/20* (2013.01); *H01L 33/38* (2013.01); *H01L 33/44* (2013.01); *H01L 33/405* (2013.01)
USPC ....... 257/99; 257/459; 257/773; 257/E33.065

(58) Field of Classification Search
CPC ......... H01L 33/20; H01L 33/38; H01L 33/44; H01L 33/405
USPC ....................... 257/98, 99, 431–433, 448, 773
See application file for complete search history.

(56) References Cited

U.S. PATENT DOCUMENTS 5,563,422 A * 10/1996 Nakamura et al. ............... 257/13
6,803,603 B1 * 10/2004 Nitta et al. ...................... 257/79
(Continued)

FOREIGN PATENT DOCUMENTS

JP    50-17186    2/1975
JP    2-114675    4/1990
(Continued)

OTHER PUBLICATIONS

Japanese Office Action issued Oct. 21, 2011, in Patent Application No. 2011-038311 (with English-language translation).

(Continued)

*Primary Examiner* — Alonzo Chambliss
(74) *Attorney, Agent, or Firm* — Oblon, Spivak, McClelland, Maier & Neustadt, L.L.P.

(57) ABSTRACT

According to one embodiment, a semiconductor light emitting device includes a p-type semiconductor layer, an n-type semiconductor layer, a light emitting layer, a p-side electrode and an n-side electrode. The p-type semiconductor layer includes a nitride semiconductor and has a first major surface. The n-type semiconductor layer includes a nitride semiconductor and has a second major surface. The light emitting layer is provided between the n-type semiconductor layer and the p-type semiconductor layer. The p-side electrode contacts a part of the p-type semiconductor layer on the first major surface. The n-side electrode contacts a part of the n-type semiconductor layer on the second major surface. The n-side electrode is provided outside and around the p-side electrode in a plan view along a direction from the p-type semiconductor layer to the n-type semiconductor layer.

25 Claims, 12 Drawing Sheets

(56) References Cited

U.S. PATENT DOCUMENTS

| | | | |
|---|---|---|---|
| 7,015,513 B2 * | 3/2006 | Hsieh | 257/99 |
| 7,154,124 B2 * | 12/2006 | Han et al. | 257/88 |
| 2005/0035355 A1 * | 2/2005 | Konno et al. | 257/79 |
| 2005/0133807 A1 * | 6/2005 | Park et al. | 257/99 |
| 2011/0031519 A1 | 2/2011 | Hirao et al. | |

FOREIGN PATENT DOCUMENTS

| | | |
|---|---|---|
| JP | 6-66043 U | 9/1994 |
| JP | 2007-158128 A | 6/2007 |
| JP | 2007-158131 | 6/2007 |
| JP | 2010-16055 A | 1/2010 |
| JP | 2010-171371 | 8/2010 |
| JP | 2011-40535 | 2/2011 |

OTHER PUBLICATIONS

Japanese Office Action issued Dec. 11, 2013 in Patent Application No. 2013-086725 with English Translation.

Office Action issued Mar. 10, 2014, in Japanese Patent Application No. 2013-086725 (with English-language Translation).

* cited by examiner

SEMICONDUCTOR LIGHT EMITTING DEVICE AND LIGHT EMITTING APPARATUS

CROSS-REFERENCE TO RELATED APPLICATIONS

This application is based upon and claims the benefit of priority from the prior Japanese Patent Application No. 2011-038311, filed on Feb. 24, 2011; the entire contents of which are incorporated herein by reference.

FIELD

Embodiments described herein relate generally to a semiconductor light emitting device and a light emitting apparatus.

BACKGROUND

In a semiconductor light emitting device, an n-type semiconductor layer, a light emitting layer, and a p-type semiconductor layer, for example, are stacked in this order. Since a sapphire substrate used for the crystal growth of a nitride semiconductor layer is an insulator, a structure providing a p-side electrode and an n-side electrode on the upper surface side of a semiconductor layer is employed. However, this structure has a high series resistance. Further, since the thermal conductivity of the sapphire substrate is low, there arises a problem that heat dissipation capability is low particularly in a high output power.

Meanwhile, there is a configuration of transferring a semiconductor layer grown on a sapphire substrate to a support substrate different from the crystal-grown substrate (thin film type). A Si substrate having electrical conductivity and a high thermal conductivity can be used as the support substrate and thereby current can flow in a stacking direction and a low series resistance and a high heat dissipation capability can be obtained at the same time. In a semiconductor light emitting device, further improvement of efficiency is being required.

DETAILED DESCRIPTION

Figure 1A:
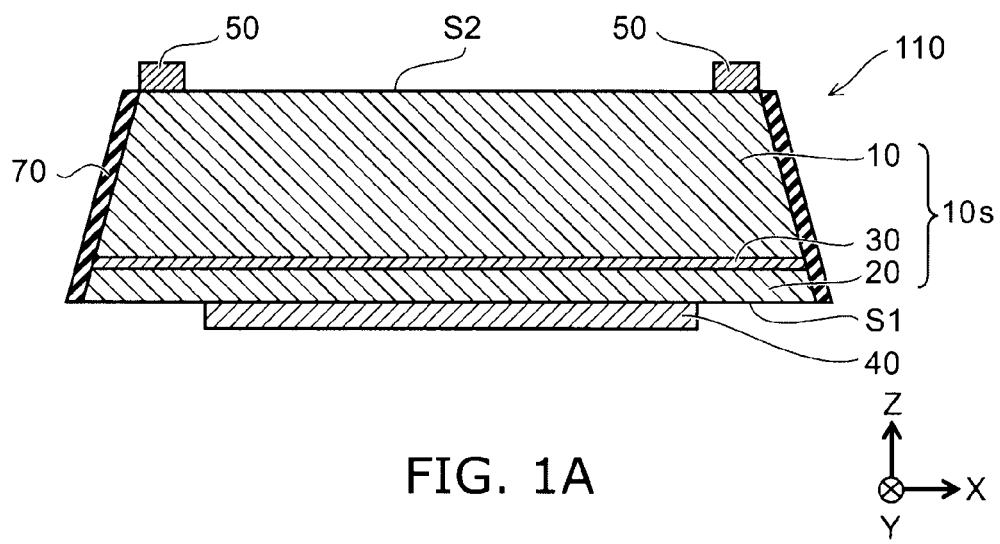
FIG. 1A and FIG. 1B are schematic views showing a semiconductor light emitting device according to a first embodiment.

In general, according to one embodiment, a semiconductor light emitting device includes a p-type semiconductor layer, an n-type semiconductor layer, a light emitting layer, a p-side electrode and an n-side electrode. The p-type semiconductor layer includes a nitride semiconductor and has a first major surface. The n-type semiconductor layer includes a nitride semiconductor and has a second major surface. The light emitting layer is provided between the n-type semiconductor layer and the p-type semiconductor layer. The first major surface is on a side of the p-type semiconductor layer opposite to the light emitting layer. The second major surface is on a side of the n-type semiconductor layer opposite to the light emitting layer. The p-side electrode contacts a part of the p-type semiconductor layer on the first major surface. The n-side electrode contacts a part of the n-type semiconductor layer on the second major surface. The n-side electrode is provided outside and around the p-side electrode in a plan view along a direction from the p-type semiconductor layer to the n-type semiconductor layer.

In general, according to another embodiment, a light emitting apparatus includes a semiconductor light emitting device and a mounting component. The semiconductor light emitting device includes a p-type semiconductor layer, an n-type semiconductor layer, a light emitting layer, a p-side electrode and an n-side electrode. The p-type semiconductor layer includes a nitride semiconductor and has a first major surface. The n-type semiconductor layer includes a nitride semiconductor and has a second major surface. The light emitting layer is provided between the n-type semiconductor layer and the p-type semiconductor layer. The first major surface is on a side of the p-type semiconductor layer opposite to the light emitting layer. The second major surface is on a side of the n-type semiconductor layer opposite to the light emitting layer. The p-side electrode contacts a part of the p-type semiconductor layer on the first major surface. The n-side electrode contacts a part of the n-type semiconductor layer on the second major surface. The n-side electrode is provided outside and around the p-side electrode in a plan view along a direction from the p-type semiconductor layer to the n-type semiconductor layer. The mounting component includes a mounting substrate, a first substrate electrode and a second substrate electrode. The mounting substrate has a mounting surface facing the first major surface. The first substrate electrode is provided on the mounting surface and electrically connected to the p-side electrode. The second substrate electrode is provided on the mounting surface and electrically connected to the n-side electrode.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

(First Embodiment)

Figure 1B:
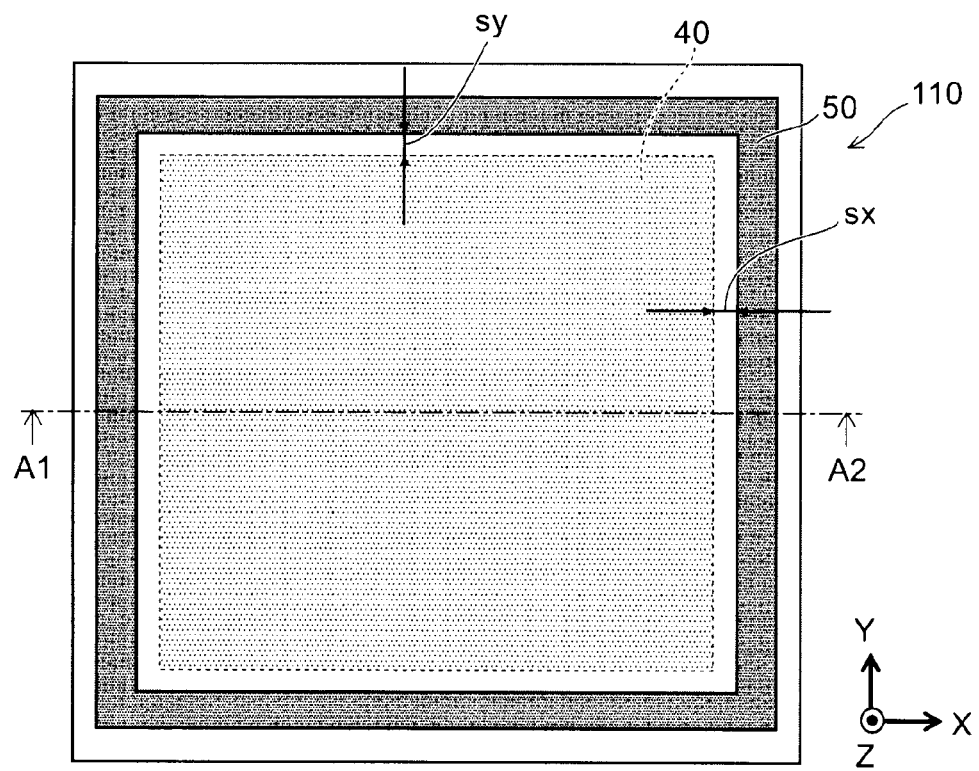

FIG. 1A and FIG. 1B are schematic views illustrating a configuration of a semiconductor light emitting device according to a first embodiment.

FIG. 1B is a schematic plan view. FIG. 1A is a cross-sectional view taken along the A1-A2 line of FIG. 1B.

As shown in FIG. 1A and FIG. 1B, a semiconductor light emitting device 110 according to the embodiment includes an n-type semiconductor layer 10, a p-type semiconductor layer 20, a light emitting layer 30, a p-side electrode 40, and an n-side electrode 50.

Each of the n-type semiconductor layer 10 and the p-type semiconductor layer 20 includes a nitride semiconductor. An n-type GaN layer is used for the n-type semiconductor layer 10, for example. A p-type GaN layer is used for the p-type semiconductor layer 20, for example.

The light emitting layer 30 is disposed between the n-type semiconductor layer 10 and the p-type semiconductor layer 20.

The p-side electrode 40 is provided on a first major surface S1 on a side opposite to the light emitting layer 30 of the p-type semiconductor layer 20. The p-side electrode 40 contacts a part of the p-type semiconductor layer 20 (part of the first major surface S1).

The n-side electrode 50 is provided on a second major surface S2 on a side opposite to the light emitting layer 30 of the n-type semiconductor layer 10. The n-side electrode 50 contacts a part of the n-type semiconductor layer 10 (part of the second major surface S2).

Here, the direction from the p-type semiconductor layer 20 toward the n-type semiconductor layer 10 is defined as a Z-axis direction. One axis perpendicular to the Z-axis is defined as an X-axis. One axis perpendicular to the Z-axis and the X-axis is defined as a Y-axis. The Z-axis direction corresponds to the stacking direction of the n-type semiconductor layer 10, the light emitting layer 30, and the p-type semiconductor layer 20.

Here, in the specification of the application, "stacking" also includes a case in which a different element is inserted in between to be stacked, in addition to a case in which layers are directly stacked.

In a stacked body 10s including the n-type semiconductor layer 10, the light emitting layer 30, and the p-type semiconductor layer 20, the first major surface S1 and the second major surface S2 are surfaces opposite to each other.

Figure 2:
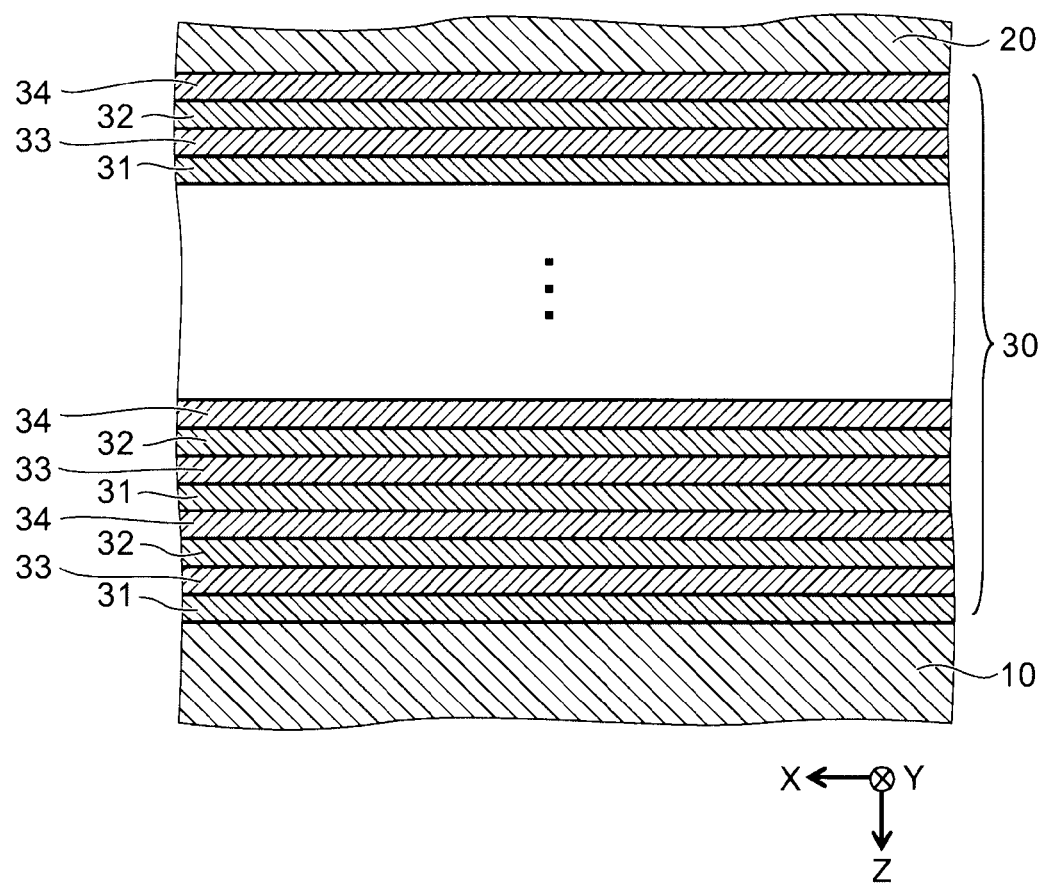
FIG. 2 is a schematic cross-sectional view showing a part of the semiconductor light emitting device according to the first embodiment.

FIG. 2 is a schematic cross-sectional view illustrating a configuration in a part of a semiconductor light emitting device according to the first embodiment.

FIG. 2 shows an example of the configuration of the light emitting layer 30. The Z-axis direction in FIG. 2 is inverted from the Z-axis direction in FIG. 1A.

As shown in FIG. 2, the light emitting layer 30 includes plural barrier layers 31 and well layers 32 each provided between the plural barrier layers 31. The plural barrier layers 31 and the plural well layers 32 are stacked alternately.

In this example, an intermediate layer (n-side intermediate layer 33 or p-side intermediate layer 34) is disposed between the barrier layer 31 and the well layer 32.

For example, the barrier layer 31 is disposed on the n-type semiconductor layer 10. The n-side intermediate layer 33 is disposed on the barrier layer 31. The well layer 32 is disposed on the n-side intermediate layer 33. The p-side intermediate layer 34 is disposed on the well layer 32. The barrier layer 31, the n-side intermediate layer 33, the well layer 32, and the p-side intermediate layer 34 compose one group (period). The plural groups are stacked. That is, the light emitting layer 30 can have a multi quantum well (MQW) structure.

Alternatively, the light emitting layer 30 can have a single quantum well (SQW) structure. In this case, the number of the above-described groups is one and the number of the well layers 32 is one.

At least any of the n-side intermediate layer 33 and the p-side intermediate layer 34 is disposed or omitted as needed.

$In_{x1}Al_{y1}Ga_{1-x1-y1}N$ ($0<x1<1$ and $0<y1<1$) is used for the barrier layer 31, for example. $In_{0.02}Al_{0.33}Ga_{0.65}N$ is used for the barrier layer 31, for example. The thickness of the barrier layer 31 is 11.5 nanometer (nm), for example.

$In_{x2}Ga_{1-x2}N$ ($0<x2<1$) is used for the n-side intermediate layer 33, for example. $In_{0.02}Ga_{0.98}N$ is used for the n-side intermediate layer 33, for example. The thickness of the n-side intermediate layer 33 is 0.5 nm, for example.

$In_{x3}Ga_{1-x3}N$ ($0<x3<1$) is used for the well layer 32. $In_{0.15}Ga_{0.85}N$ is used for the well layer 32, for example. The thickness of the well layer 32 is 2.5 nm, for example.

$In_{x4}Ga_{1-x4}N$ ($0<x4<1$) is used for the p-side intermediate layer 34. $In_{0.02}Ga_{0.98}N$ is used for the p-side intermediate layer 34, for example. The thickness of the p-side intermediate layer 34 is 0.5 nm, for example.

In the embodiment, at least any of the materials and the thicknesses used for the respective plural barrier layers 31 may be different from one another among the plural barrier layers 31. When the plural well layers 32 are disposed, at least any of the materials and the thicknesses used for the respective plural well layers 32 may be different form one another among the plural well layers 32. When the plural n-side intermediate layers 33 are disposed, at least any of the materials and the thicknesses used for the respective plural n-side intermediate layers 33 may be different from one another among the plural n-side intermediate layers 33. When the plural p-side intermediate layers 34 are disposed, at least any of the materials and the thicknesses used for the respective plural p-side intermediate layers 34 may be different from one another among the plural p-side intermediate layers 34.

As shown in FIG. 1A and FIG. 1B, in the semiconductor light emitting device 110 according to the embodiment, the n-side electrode 50 is provided outside and around the p-side electrode 40 in the plan view.

In the plan view, the axis connecting the viewing point and the viewing object is parallel to the stacking direction (Z-axis) direction). That is, the image of the n-side electrode 50 projected onto the X-Y plane is provided outside and around the image of the p-side electrode 40 projected onto the X-Y plane. In the plan view (when viewed along the Z-axis), the n-side electrode 50 does not overlap the p-side electrode 40.

For example, as shown in FIG. 1B, a gap is provided between the n-side electrode 50 and the p-side electrode 40 in the plan view. A gap sx along the X-axis at the portion where the image of the n-side electrode 50 projected onto the X-Y plane and the image of the p-side electrode 40 projected onto the X-Y plane face each other is larger than zero. A gap sy along the Y-axis at the portion where the image of the n-side electrode 50 projected onto the X-Y plane and the image of the p-side electrode 40 projected onto the X-Y plane face each other is larger than zero. The gap sx and the gap sy may be different from each other.

In the semiconductor light emitting device 110, the n-side electrode 50 and the p-side electrode 40 do not overlap each other when viewed along the Z-axis and thereby excessive current concentration can be suppressed.

Thereby, uniformity can be improved in a light emission distribution. Further, since the n-side electrode 50 is provided in the peripheral part of the second major surface S2, light extraction efficiency can be improved. Accordingly, it is possible to obtain a highly efficient semiconductor light emitting device and to obtain a high output.

Figure 3A:
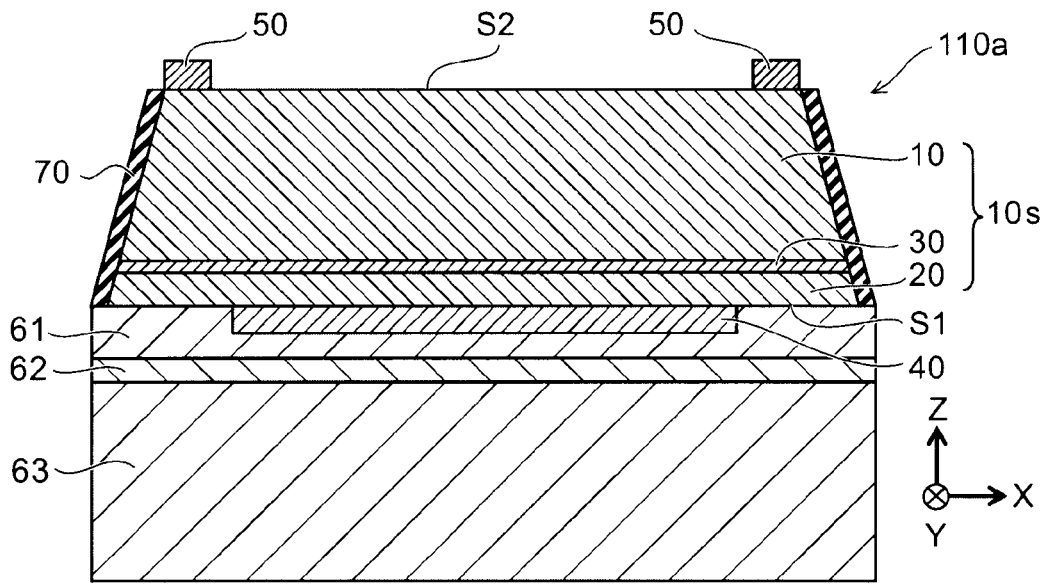
FIG. 3A and FIG. 3B are schematic views showing another semiconductor light emitting device according to the first embodiment.
Figure 3B:
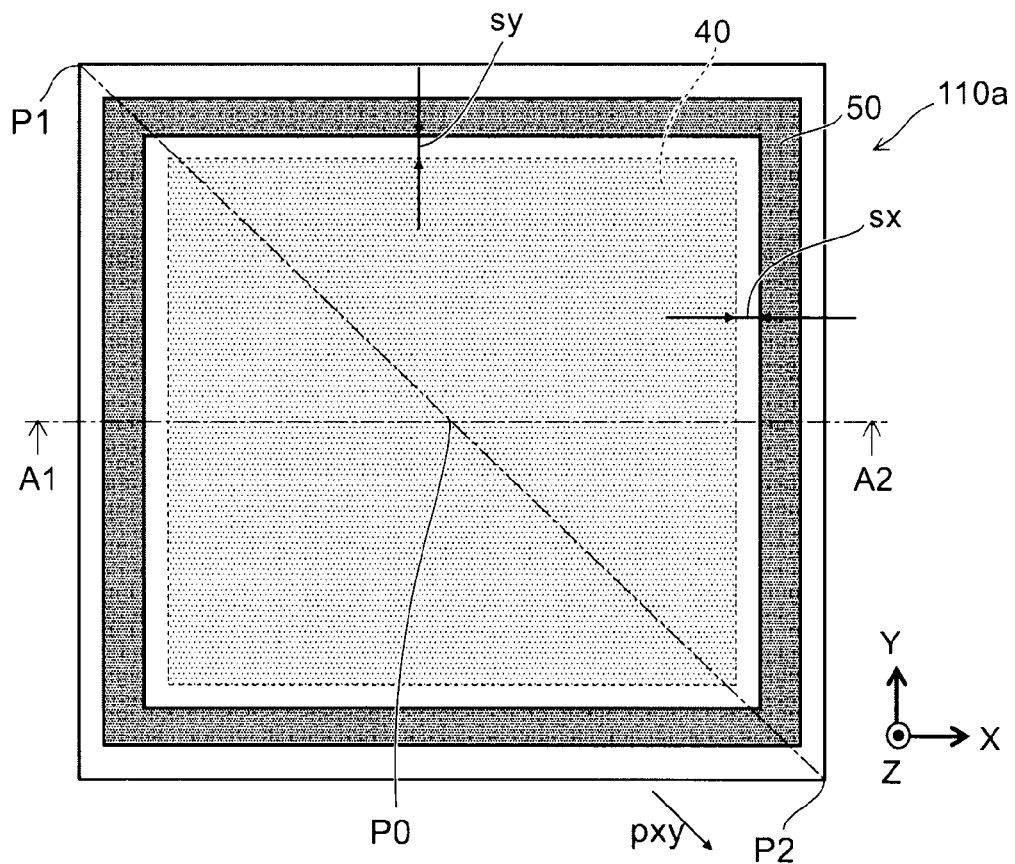

FIG. 3A and FIG. 3B are schematic views illustrating a configuration of another semiconductor light emitting device according to the first embodiment.

FIG. 3B is a schematic plan view. FIG. 3A is a cross-sectional view taken along the A1-A2 line of FIG. 3B.

As shown in FIG. 3A and FIG. 3B, another semiconductor light emitting device 110a according to the embodiment further includes a first bonding layer 61 (high resistance layer) in addition to the n-type semiconductor layer 10, the p-type semiconductor layer 20, the light emitting layer 30, the p-side electrode 40, and the n-side electrode 50.

The first bonding layer 61 contacts the p-type semiconductor layer 20 on the first major surface S1 of the p-type semiconductor layer 20. The first bonding layer 61 has a part outside the p-side electrode 40 in the plan view. The electrical resistance between the first bonding layer 61 and the p-type semiconductor layer 20 is higher than that between the p-side electrode 40 and the p-type semiconductor layer 20. The first bonding layer 61 has a part overlapping the n-side electrode 50 in the plan view.

The high resistance with the p-type semiconductor layer 20 includes at least any of a high contact resistance with the p-type semiconductor layer 20 and a high resistance of the first bonding layer 61. That is, the contact resistance between the first bonding layer 61 and the p-type semiconductor layer 20, for example, is higher than that between the p-side electrode 40 and the p-type semiconductor layer 20. The electrical resistance of the first bonding layer 61, for example, is higher than that of the p-side electrode 40. The conductivity of the first bonding layer 61 is lower than that of the p-side electrode 40. For example, the first bonding layer 61 may have an insulating property.

While the first bonding layer 61 overlaps the n-side electrode 50 in a plan view, since the electrical resistance between the first bonding layer 61 and the p-type semiconductor layer 20 is higher than that between the p-side electrode 40 and the p-type semiconductor layer 20, current flowing between the n-side electrode 50 and the first bonding layer 61 is small and current flows substantially between the n-side electrode 50 and the p-side electrode 40. Thereby, excessive current concentration is suppressed. Accordingly the uniformity in the light emission distribution can be improved and a high efficiency can be obtained.

In this example, the first bonding layer 61 has conductivity. That is, the contact resistance between the first bonding layer 61 and the p-type semiconductor layer 20 is higher than that between the p-side electrode 40 and the p-type semiconductor layer 20. In this example, the first bonding layer 61 covers the p-side electrode 40.

Ni, for example, is used for the part of the p-side electrode 40 contacting the p-type semiconductor layer 20. Ti is used for the part of the first bonding layer 61 contacting the p-type semiconductor layer 20. The contact resistance of Ti with the p-type GaN is higher than that of Ni with p-type GaN.

The semiconductor light emitting device 110a further includes a substrate 63 and a second bonding layer 62. The second bonding layer 62 is provided between the substrate 63 and the p-side electrode 40. The first bonding layer 61 is provided between the second bonding layer 62 and the p-side electrode 40. A Si substrate is used for the substrate 63, for example. Metal (including alloy), for example, is used for the first bonding layer 61 and the second bonding layer 62. The substrate 63, the first bonding layer 61, and the second bonding layer 62 have conductivity. Thereby, the p-side electrode 40 and the substrate 63 are electrically connected to each other.

Further, a protection layer 70 is disposed on the side surface of the stacked body 10s. The protection layer 70 extends over the surface of a part of the first bonding layer 61.

Hereinafter, a manufacturing method of the semiconductor light emitting device 110a will be described.

FIG. 4 to FIG. 7 are schematic cross-sectional views illustrating a manufacturing method of the semiconductor light emitting device according to the first embodiment in a process order.

Figure 4:
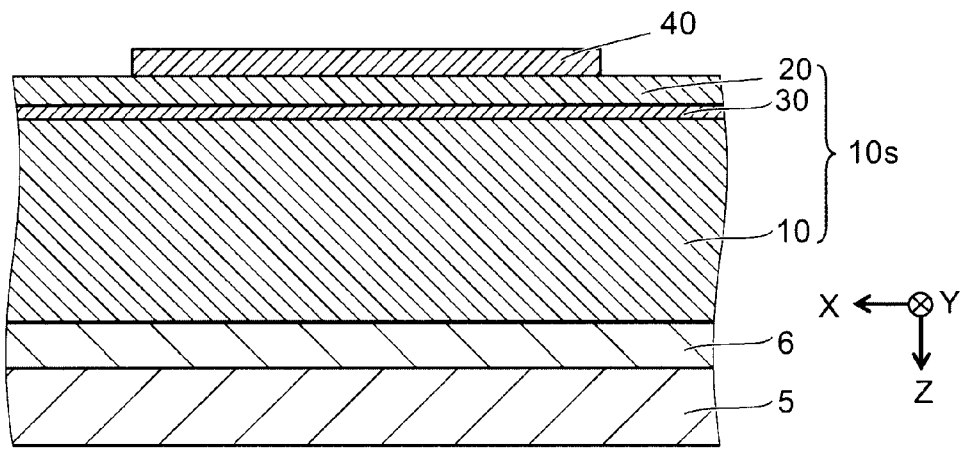
FIG. 4 to FIG. 7 are schematic cross-sectional views showing a manufacturing method of the semiconductor light emitting device according to the first embodiment in a process order.

As shown in FIG. 4, a buffer layer 6 is formed on a growth substrate 5. A sapphire substrate, for example, is used for the growth substrate 5. On the buffer layer 6, the n-type semiconductor 10, the light emitting layer 30, the p-type semiconductor layer 20 are formed sequentially. A metal-organic chemical vapor deposition (MOCVD) method, for example, is used for forming each of the above layers.

A conductive film for providing the p-side electrode 40 is formed on the p-type semiconductor layer 20. A stacked film of a Ni film and an Ag film is used for the conductive film, for example. An evaporation method is used for forming this conductive film, for example. After that, this conductive film is processed into a predetermined shape by photolithography and etching, for example. Thereby, the p-side electrode 40 is formed. The p-side electrode 40 is provided at the center part of the first major surface S1.

Figure 5:
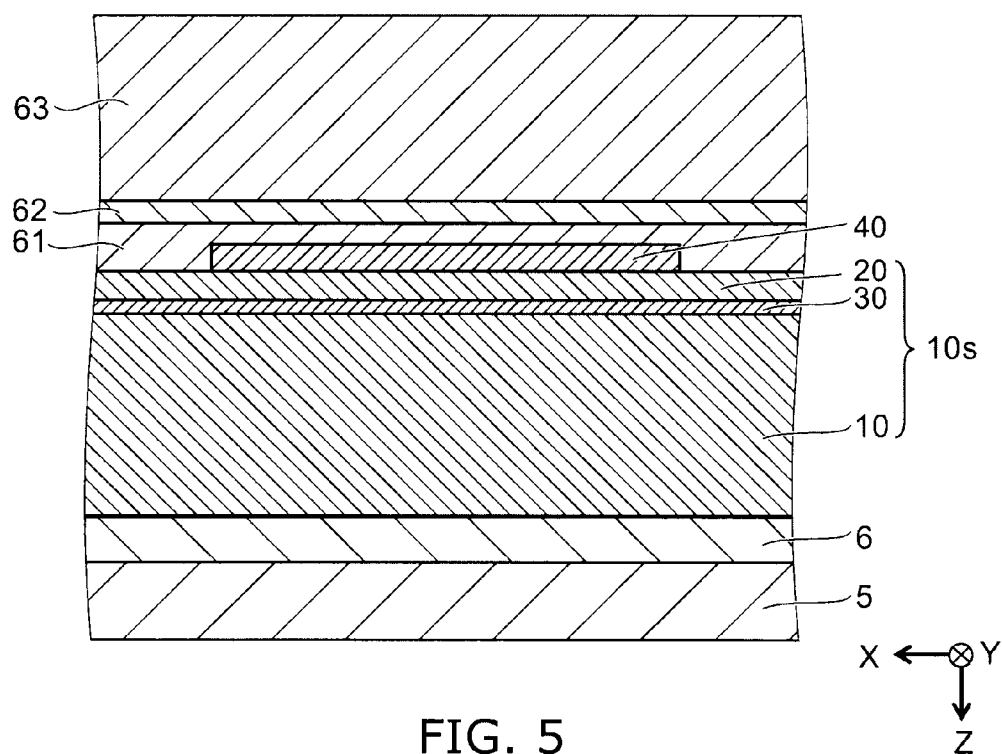

As shown in FIG. 5, the first bonding layer 61 is formed so as to cover the first major surface S1 of the p-type semiconductor layer 20 and the p-side electrode 40. A Ti film, a Pt film, and an Au film are stacked and formed in this order to provide the first bonding layer 61.

Meanwhile, the second bonding layer 62 is formed on a major surface of the substrate 63 (e.g., Si substrate). An Au—Sn film, for example, is formed on the major surface of the substrate 63 to provide the second bonding layer 62.

As shown in FIG. 5, the growth substrate 5 and the substrate 63 are disposed so as to cause the first bonding layer 61 and the second bonding layer 62 to contact each other. In this state, pressure is applied to both of the substrates at a high temperature for a certain time. This temperature is approximately 250° C., for example. Thereby, the first bonding layer and the second bonding layer 62 are bonded with each other.

Next, the above stacked body 10s is irradiated with ultraviolet light, for example, via the growth substrate 5. A KrF laser having a wavelength of 248 nm is used for the ultra-violet light, for example. The ultra-violet light is pulse-irradiated, for example. Thereby, the growth substrate 5 is removed from the stacked body 10s. That is, the buffer layer 6 and the n-type semiconductor layer 10 are separated from each other, for example.

Figure 6:
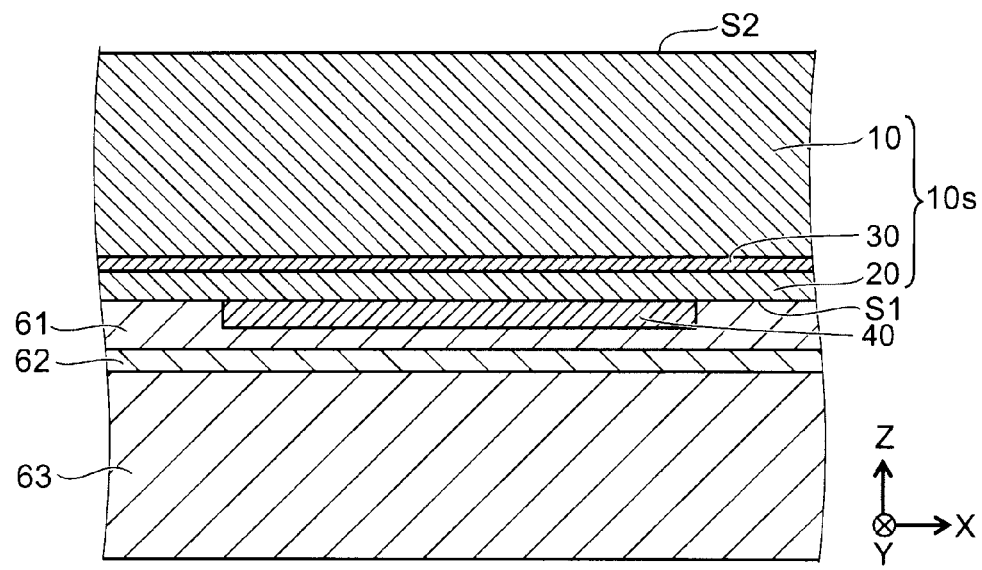

Thereby, as shown in FIG. 6, the second major surface S2 of the n-type semiconductor layer 10 is exposed. The second major surface S2 corresponds to the surface to be wet-etched, as described below.

The above process is performed so as to form the plural semiconductor light emitting devices on the growth substrate 5 at the same time, for example.

Figure 7:
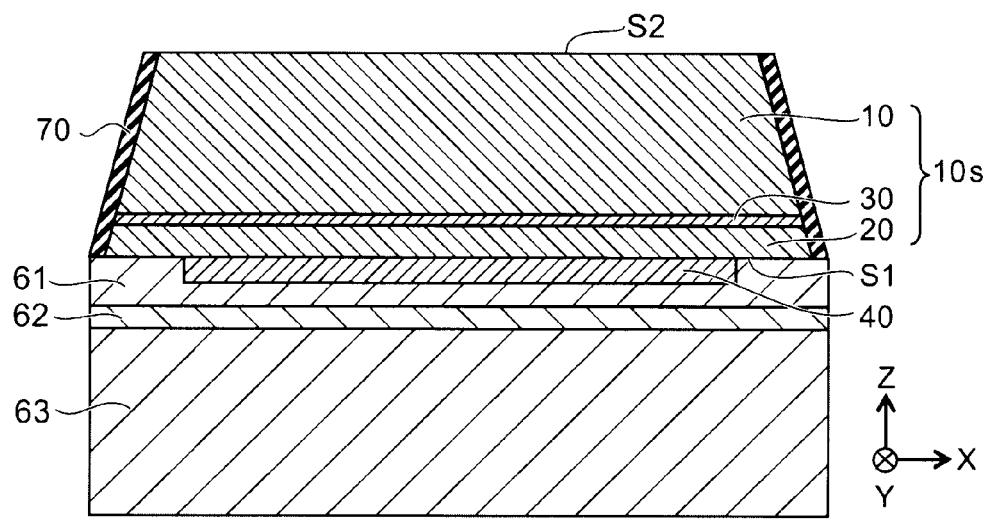

As shown in FIG. 7, the stacked body 10s is patterned and divided into the plural semiconductor light emitting devices by the use of a lithography technique, for example. In this patterning, the cross section of the stacked body 10s is formed as a mesa having a tapered shape. That is, the width of the n-type semiconductor layer 10 along the X-axis is smaller than that of the p-type semiconductor layer 20 along the X-axis, for example. The width of the n-type semiconductor layer 10 along the Y-axis is smaller than that of the p-type semiconductor layer 20 along the Y-axis, for example.

In this patterning, the first bonding layer 61 is not divided, for example. The bonding layer 61 is exposed between the plural semiconductor light emitting devices.

Then, an SiO$_2$ film, for example, is formed to provide the protection layer 70 so as to cover the side surface of the taper-shaped stacked body 10s and the exposed surface of the first bonding layer 61. The part of the SiO$_2$ film which covers the second major surface S2 of the n-type semiconductor layer 10 is removed. Thereby, the protection layer 70 is formed. At this time, the SiO$_2$ film of the part along the outer edge of the second major surface S2 of the n-type semiconductor layer 10 may be left. Thereby, the part along the outer edge of the n-type semiconductor layer 10 is protected by the protection layer 70.

At this time, irregularity can be formed on the surface of the exposed n-type semiconductor layer 10 by etching using potassium hydrate, for example. For example, the etching is performed for 15 minutes using potassium hydrate having a concentration of 1 mol/l and a temperature of 70° C. BY such wet etching, the second major surface S2 of the n-type semiconductor layer 10 is roughened. On the second major surface S2, the n-type semiconductor layer 10 has a surface roughness approximately not smaller than 100 nm and not larger than 3,000 nm.

Then, the n-side electrode 50 is formed on the part except the center of the second major surface S2 of the n-type semiconductor layer 10. For example, a metal film such as Ti, Al, Rh, In, Ni, Pt and Au is formed as the n-side electrode 50 and processed into a predetermined shape. Thereby, the semiconductor light emitting device 110a illustrated in FIG. 3A and FIG. 3B is formed.

In this manner, the n-side electrode 50 includes at least one selected from the group of Ti, Al, Rh, In, Ni, Pt and Au.

Hereinafter, the characteristic of the semiconductor light emitting device 110a according to the embodiment will be described together with a reference example.

Figure 8A:
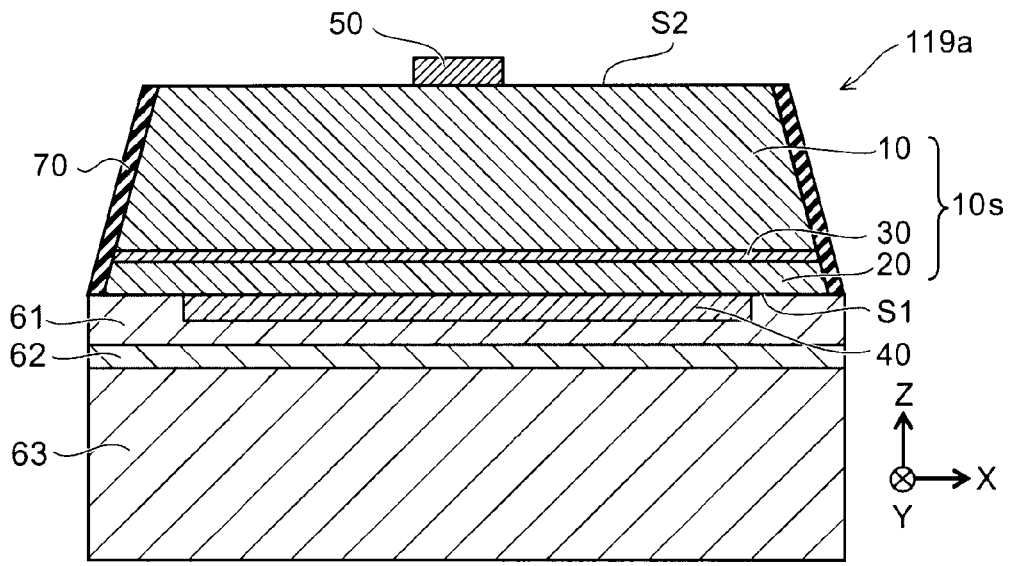
FIG. 8A and FIG. 8B are schematic views showing a semiconductor light emitting device of a first reference example.
Figure 8B:
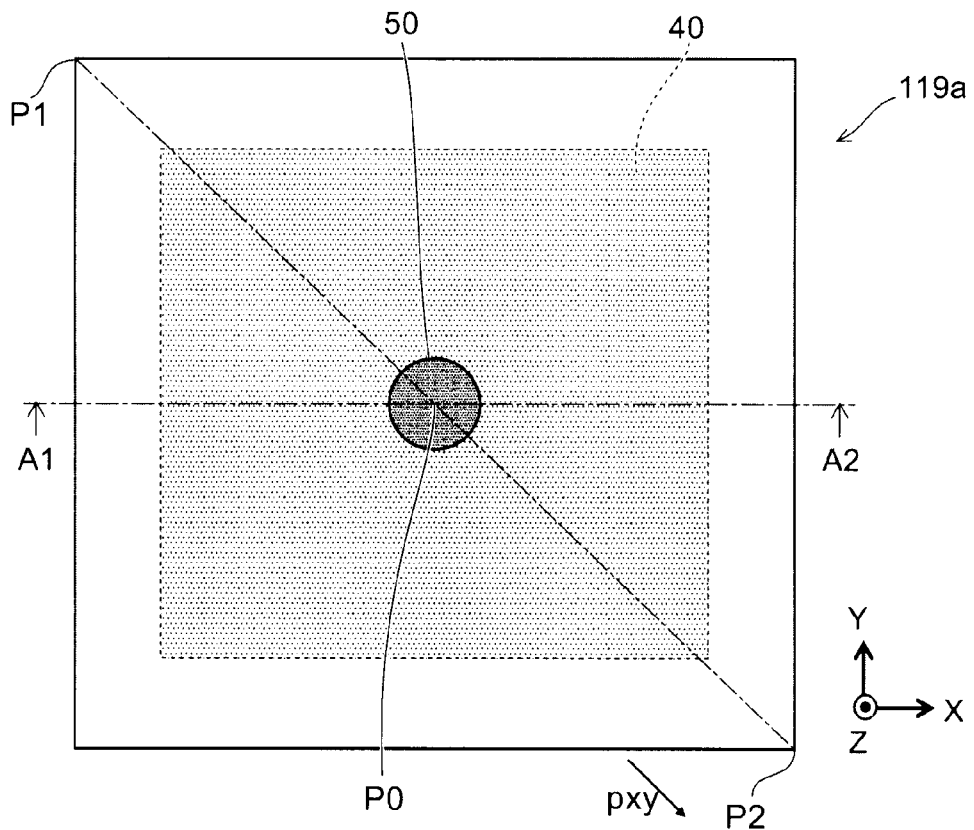

FIG. 8A and FIG. 8B are schematic views showing a configuration of a semiconductor light emitting device of a first reference example.

FIG. 8B is a schematic plan view and FIG. 8A is a cross-sectional view taken along the A1-A2 line of FIG. 8B.

As shown in FIG. 8A and FIG. 8B, the n-side electrode 50 is provided in the center part of the second major surface S2 in a semiconductor light emitting device 119a of the first reference example. The n-side electrode 50 is disposed inside the outer edge of the p-side electrode 40 in the plan view. That is, the n-side electrode 50 overlaps the p-side electrode 40 in the plan view (when viewed along the Z-axis direction). In the semiconductor light emitting device 119a, current is concentrated in the part where the n-side electrode 50 and the p-side electrode 40 overlaps each other.

Figure 9A:
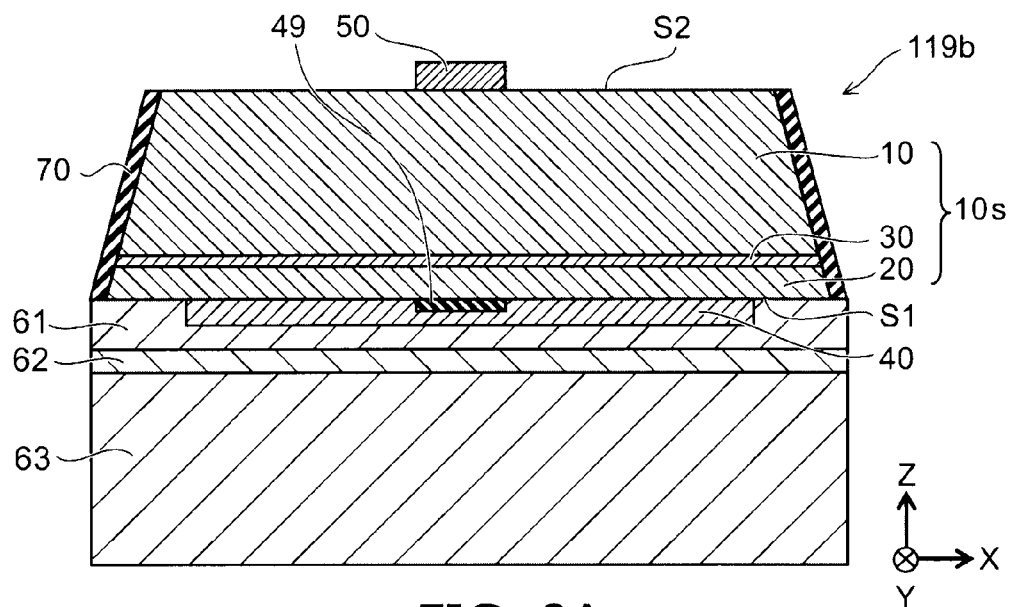
FIG. 9A and FIG. 9B are schematic views showing a semiconductor light emitting device of a second reference example.
Figure 9B:
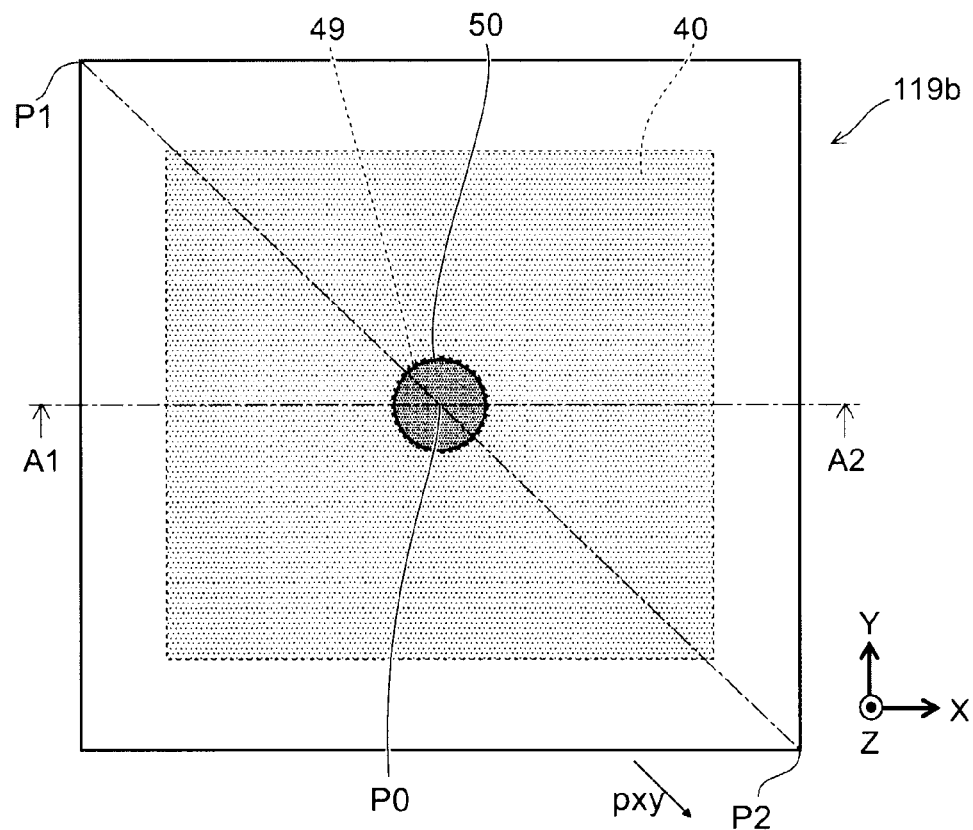

FIG. 9A and FIG. 9B are schematic views showing a configuration of a semiconductor light emitting device of a second reference example.

FIG. 9B is a schematic plan view. FIG. 9A is a cross-sectional view taken along the A1-A2 line of FIG. 9B.

As shown in FIG. 9A and FIG. 9B, in the semiconductor light emitting device 119b of the second reference example, the n-side electrode 50 is provided in the center part of the second major surface S2. Then, an insulating layer 49 is provided between the p-type semiconductor layer 20 and the p-side electrode 40. The insulating layer 49 overlaps the n-side electrode 50 in the plan view. Thereby, in the semiconductor light emitting device 119b, current is not concentrated in the part where the n-side electrode 50 and the p-side electrode 40 overlap each other. However, current is concentrated at a part around the n-side electrode 50 in the plan view.

The light emitting characteristic was simulated for the semiconductor light emitting devices 110a (110), 119a, and 119b.

Figure 10:
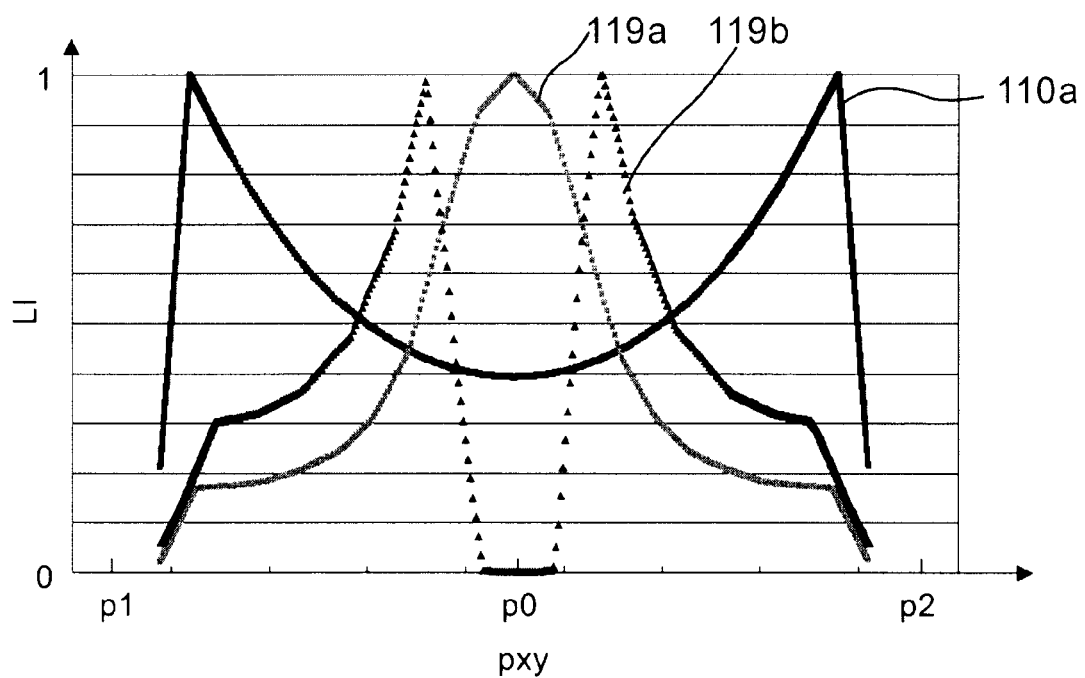
FIG. 10 is a graph showing a characteristic of the semiconductor light emitting device.

FIG. 10 is a graph illustrating a characteristic of the semiconductor light emitting device.

FIG. 10 illustrates simulation results of the light emitting characteristics of the semiconductor light emitting devices 110a, 119a and 119b, respectively. The horizontal axis in each of these drawings is a position in the X-Y plane pxy.

As shown in FIG. 3B, FIG. 8B and FIG. 9B, the position pxy is a position along a diagonal of the stacked body 10s in a plan view. The position p0 corresponds to the center of the stacked body 10s. The position p1 corresponds to one edge of the stacked body 10s. The position p2 corresponds to the other edge of the stacked body 10s. The vertical axis expresses a light emission power intensity LI (normalized value).

As shown in FIG. 10, in the semiconductor light emitting device 119a of the first reference example, the light emission power intensity LI is high in the center part but the light emission power intensity LI is degraded considerably in the peripheral part. In this manner, the light emission distribution is extremely non-uniform. This is because current is concentrated excessively in the part where the n-side electrode 50 and the p-side electrode 40 overlaps each other.

In the semiconductor light emitting device 119b of the second reference example, the light emission power intensity LI is low in the center part. Further, while the light emission power intensity LI is high around the center part, the light emission power intensity LI is low in the peripheral part. In the semiconductor light emitting device 119b, current does not flow in the part where the n-side electrode 50 and the p-side electrode 40 overlap each other but current is concentrated around the center part. Also in this case, the light emission distribution is non-uniform.

On the other hand, in the semiconductor light emitting device 110a, there is not a part where the light emission power intensity LI is considerably low. That is, the light emission power intensity LI is made uniform. In the semiconductor light emitting device 110a, the n-side electrode 50 is provided outside the p-side electrode 40 and the n-side electrode 50 is disposed so as not to overlap the p-side electrode 40 in the plan view. Thereby, excessive current concentration is suppressed and thereby the light emission power intensity LI is made uniform.

In the semiconductor light emitting device 119a, while a high light emission power intensity LI is obtained in the center part, the light extraction efficiency is low because the light-blocking n-side electrode 50 is provided in the center part of the second major surface S2. In the semiconductor light emitting device 119b, the insulating layer 49 is provided in the center part corresponding to the n-side electrode 50, and thereby, while the light emission is suppressed in the center part and the light emission is high around the center part, the light emission power intensity LI is considerably degraded in the peripheral part.

On the other hand, in the semiconductor light emitting device 110a according to the embodiment, the n-side electrode 50 is provided in the peripheral part of the second major surface S2 and thereby the light extraction efficiency is high.

The average efficiency was 59.4% for the semiconductor light emitting device 110a, 57.7% for the semiconductor light emitting device 119a, and 58.1% for the semiconductor light emitting device 119b. In this manner, in the semiconductor light emitting device 110a according to the embodiment, a higher efficiency is obtained than in the reference examples.

In the embodiment, the bias of distribution of the light emission power intensity LI is small in a wide range and thereby a high efficiency is obtained.

Then, the operating voltage was 4.21 volt (V) for the semiconductor light emitting device 110a, 5.38 V for the semiconductor light emitting device 119a, and 5.70 V for the semiconductor light emitting device 119b when a forward current of 350 mA (milliampere) is applied. In this manner, in the semiconductor light emitting device 110a according to the embodiment, the operating voltage can be made lower than those in the reference examples.

Hereinafter, a relationship between the gap between the n-side electrode 50 and the p-side electrode 40 in the plan view and the characteristic will be described.

Figure 11A:
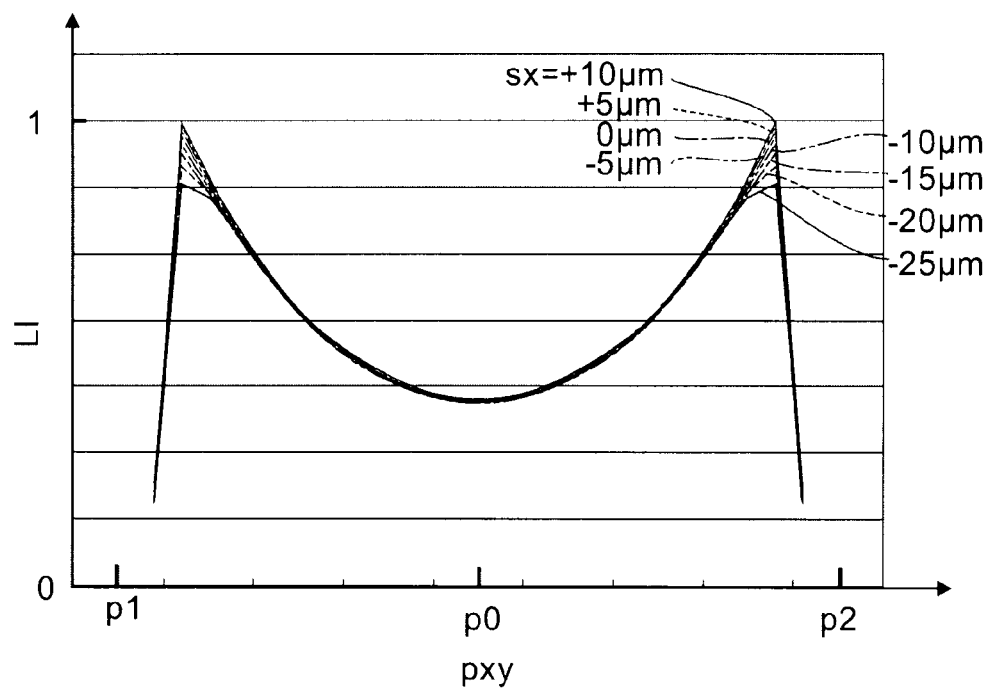
FIG. 11A and FIG. 11B are graphs showing characteristics of the semiconductor light emitting device.
Figure 11B:
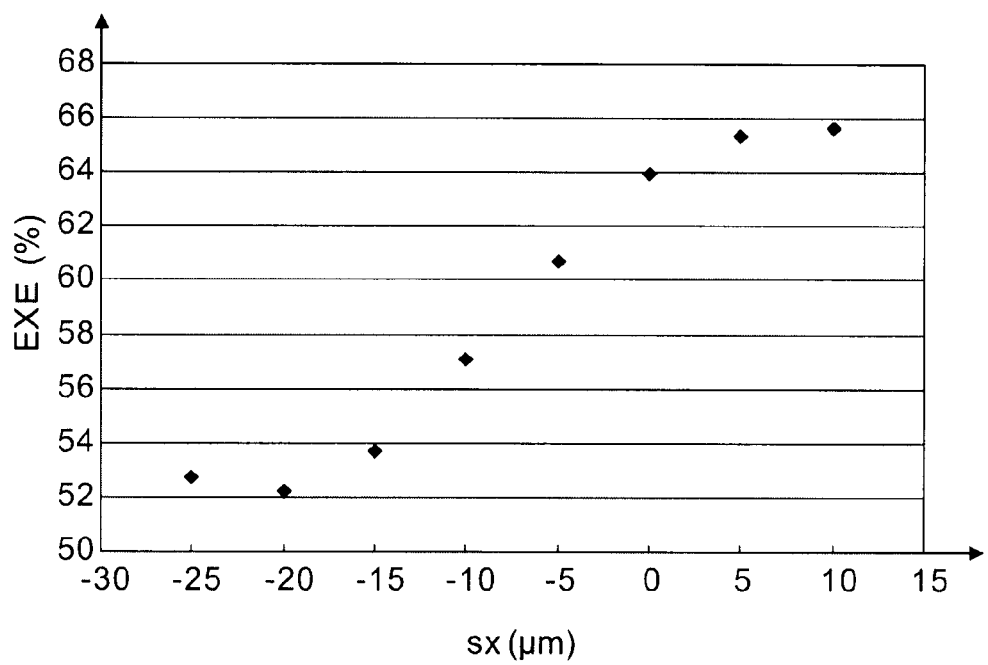

FIG. 11A and FIG. 11B show a simulation result of the characteristic when the gap between the n-side electrode 50 and the p-side electrode 40 in the plan view is changed in the configuration of the semiconductor light emitting device 110a illustrated in FIG. 3A and FIG. 3B.

Here, the gap corresponds to the gap sx and the gap sy illustrated in FIG. 3B. In this simulation, the gap sy is assumed to be the same as the gap sx. The case of the gap sx having a positive value corresponds to the state in which the n-side electrode 50 is disposed outside the p-side electrode 40 and does not overlap the p-side electrode 40 in the plan view. The case of the gap sx having a positive value corresponds to the embodiment. On the other hand, the case of the gap sx having a negative value corresponds to the state in which the n-side electrode 50 overlaps the p-side electrode 40 in the plan view. The case of the gap sx having a negative value corresponds to the reference examples.

The horizontal axis of FIG. 11A is the position pxy and the vertical axis is the light emission power intensity LI. As shown in FIG. 11A, when the gap sx is made smaller, the light emission efficiency is degraded in the peripheral part of the device. When the gap sx has a negative value and the absolute value thereof is made larger, the light emission efficiency is degraded considerably in the peripheral part of the device. That is, in the reference example in which the n-side electrode 50 overlaps the p-side electrode 40 in the plan view, the light emission power intensity LI becomes low in the peripheral part of the device.

The horizontal axis of FIG. 11B is the gap sx and the vertical axis is a light extraction efficiency EXE. As shown in FIG. 11B, when the sx has a negative value, the light extraction efficiency EXE is low. When the gap sx is made larger from zero, the light extraction efficiency EXE becomes stable at a high value.

In this manner, in the embodiment, the gap between the n-side electrode 50 and the p-side electrode 40 (gap sx and gap sy) is set at a value larger than zero in the plan view.

For example, in the plan view, the gap between the n-side electrode 50 and the p-side electrode 40 (gap sx and gap sy) is preferably larger than the thickness of the n-type semiconductor layer 10 (length of the n-type semiconductor layer 10 along the Z-axis). Thereby, the light extraction efficiency EXE is improved.

For example, in the plan view, the gap between the n-side electrode 50 and the p-side electrode 40 is preferably larger than the sum of the thickness of the n-type semiconductor layer 10, the thickness of the light emitting layer 30 and the thickness of the p-type semiconductor layer 20. Thereby, the light extraction efficiency EXE is improved further effectively.

For example, in the plan view, the gap between the n-side electrode 50 and the p-side electrode 40 is preferably not less than one micrometer (μm). The gap between the n-side electrode 50 and the p-side electrode 40 is further preferably not less than 5 μm. Thereby, a further higher light extraction efficiency EXE is obtained.

In the embodiment, the gap between the n-side electrode 50 and the p-side electrode 40 (gap sx and gap sy, or the like) is set at a value not larger than 100 μm, in the plan view. When the gap is larger than 100 μm, a current path becomes excessively long, for example, and the light emission efficiency is degraded.

Figure 12A:
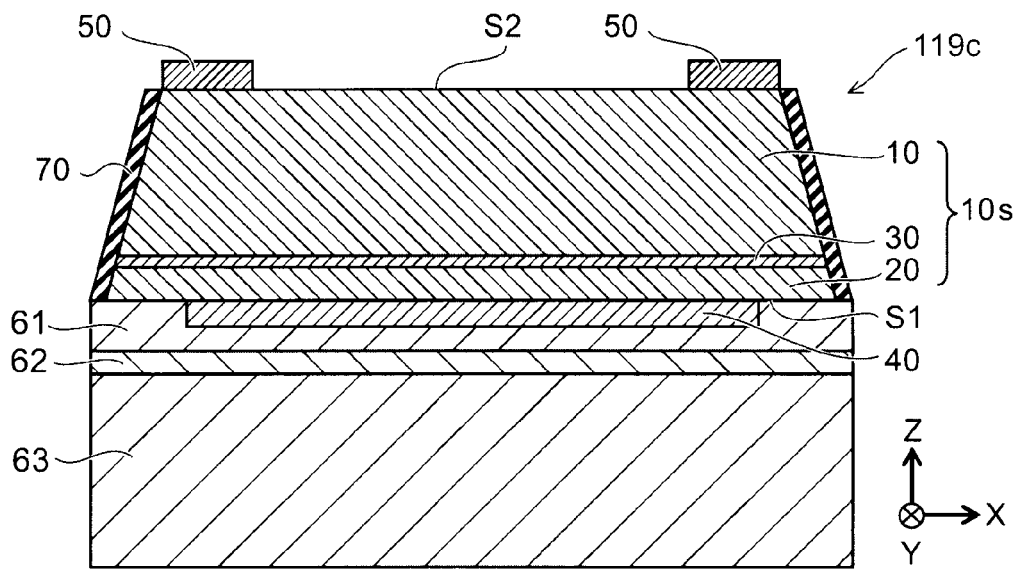
FIG. 12A and FIG. 12B are schematic views showing configurations of semiconductor light emitting devices of a third and a fourth reference example.
Figure 12B:
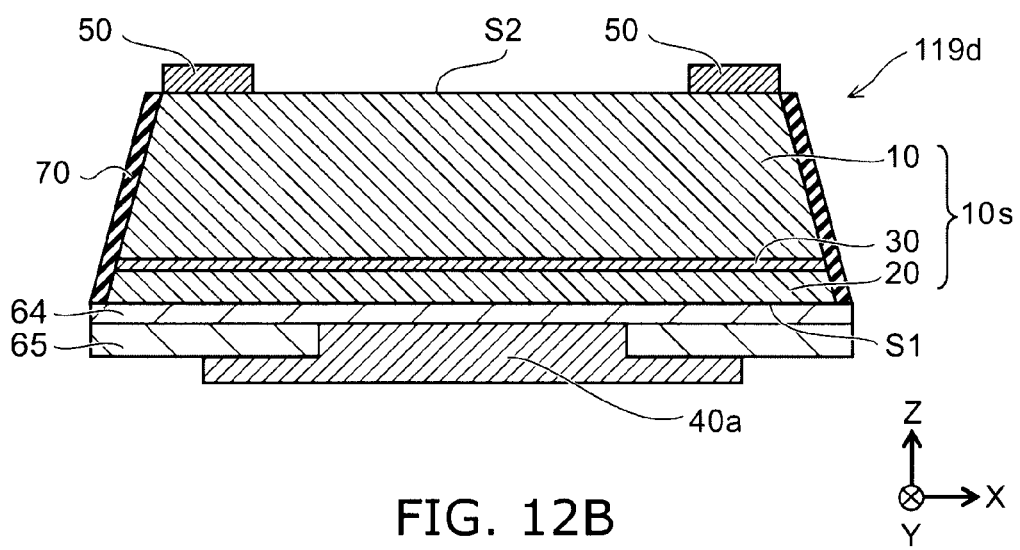

FIG. 12A and FIG. 12B are schematic views showing configurations of semiconductor light emitting devices of a third and a fourth reference example, respectively.

As shown in FIG. 12A, in the semiconductor light emitting device 119c of the third reference example, the n-side electrode 50 is provided along the peripheral edge of the p-side electrode 40 and the n-side electrode 50 has a part overlapping the p-side electrode 40 in the plan view. That is, this corresponds to the case of the gap sx having a negative value. The semiconductor light emitting device 119c has a low light extraction efficiency.

As shown in FIG. 12B, in a semiconductor light emitting device 119d, a transparent electrode 64 is provided on the whole first major surface S1 of the p-type semiconductor layer 20. Then, a reflection stacked layer 65 is provided along the peripheral edge of the transparent electrode 64. A p-side electrode 40a is provided so as to cover the center part of the transparent electrode 64 and the reflection stacked layer 65. In this case, current flows between the n-side electrode 50 and the transparent electrode 64. Thereby, current is concentrated in the part where the n-side electrode 50 and the transparent electrode 64 overlaps each other in the plan view. Accordingly, the light emission power intensity LI is high in the part where the n-side electrode 50 and the transparent electrode 64 overlap each other, but low in the other part. Then, this case also corresponds to the case of the gap sx having a negative value. In the semiconductor light emitting device 119d, the light extraction efficiency is low.

Figure 13A:
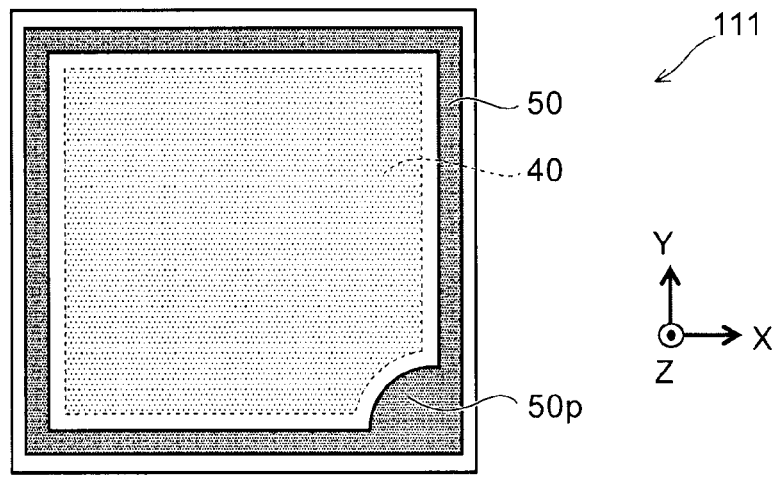
FIG. 13A to FIG. 13C are schematic plan views each showing the configuration of another semiconductor light emitting device according to the first embodiment.
Figure 13B:
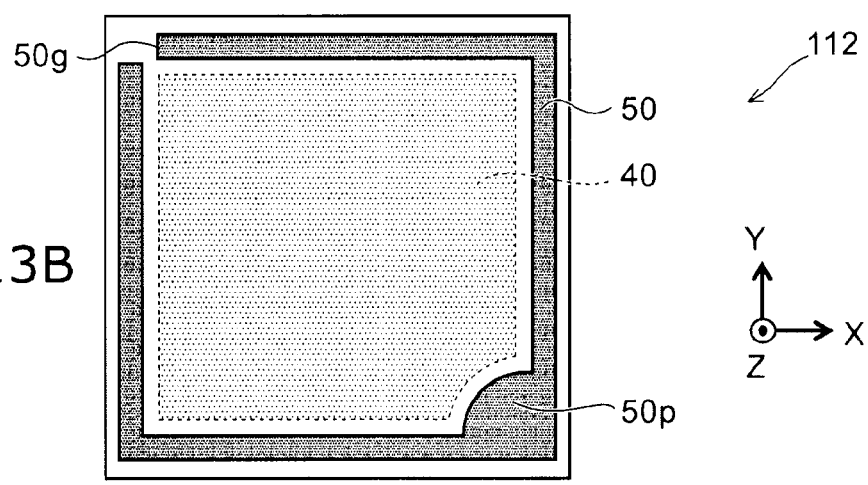
Figure 13C:
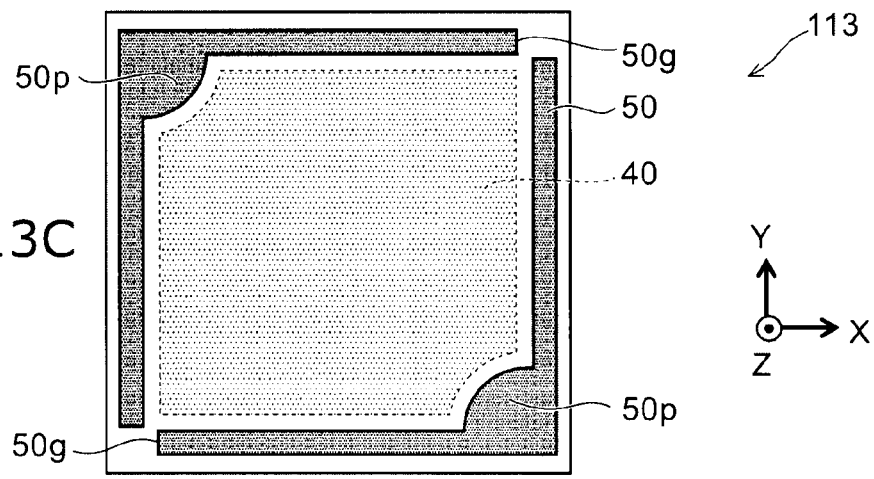

FIG. 13A to FIG. 13C are schematic plan views each illustrating a configuration of another semiconductor light emitting device according to the first embodiment.

As shown in FIG. 13A, in a semiconductor light emitting device 111 according to the embodiment, a pad part 50p is provided at a part of the n-side electrode 50. A pad (not shown in the drawing) is provided on the pad part 50p. The width of the pad part 50p is larger than that of the other part of the n-side electrode 50.

As shown in FIG. 13B, in a semiconductor light emitting device 112 according to the embodiment, a gap part 50g is provided in a part of the n-side electrode 50. In the plan view, the gap part 50g is disposed at a position diagonal to the position where the pad part 50p is provided. In this case, the n-side electrode 50 does not surround the whole p-side electrode 40 in the plan view. Also in this case, the n-side electrode 50 is provided outside and around the p-side electrode 40 in the plan view.

As shown FIG. 13C, in a semiconductor light emitting device 113 according to the embodiment, two pad parts 50p are provided. In the plan view, the two pad parts 50p are provided at respective positions which are diagonal to each other in the stacked body 10s. Then, two gap parts 50g are provided. Also in this case, the n-side electrode 50 is provided outside and around the p-side electrode 40.

On the other hand, in the semiconductor light emitting devices 110 and 110a, the n-side electrode 50 surrounds the whole outer edge of the p-side electrode 40 in the plan view. That is, the n-side electrode 50 surrounds the whole outer edge of the p-side electrode 40 continuously in the plan view.

As already described, the reference example of not separating the sapphire substrate is a lateral conduction type in which current flows in a direction perpendicular to the stacking direction. In this configuration, a high series resistance and a low heat dissipation capability prevent a further higher efficiency and higher output.

On the other hand, the semiconductor light emitting device according to the embodiment employs a thin film type vertical conduction type structure. Thereby, the series resistance is low and the heat dissipation capability is high. Then, the light emission distribution is uniform. Further, the light extraction efficiency is high. That is, a high efficiency is obtained.

(Second Embodiment)

Figure 14:
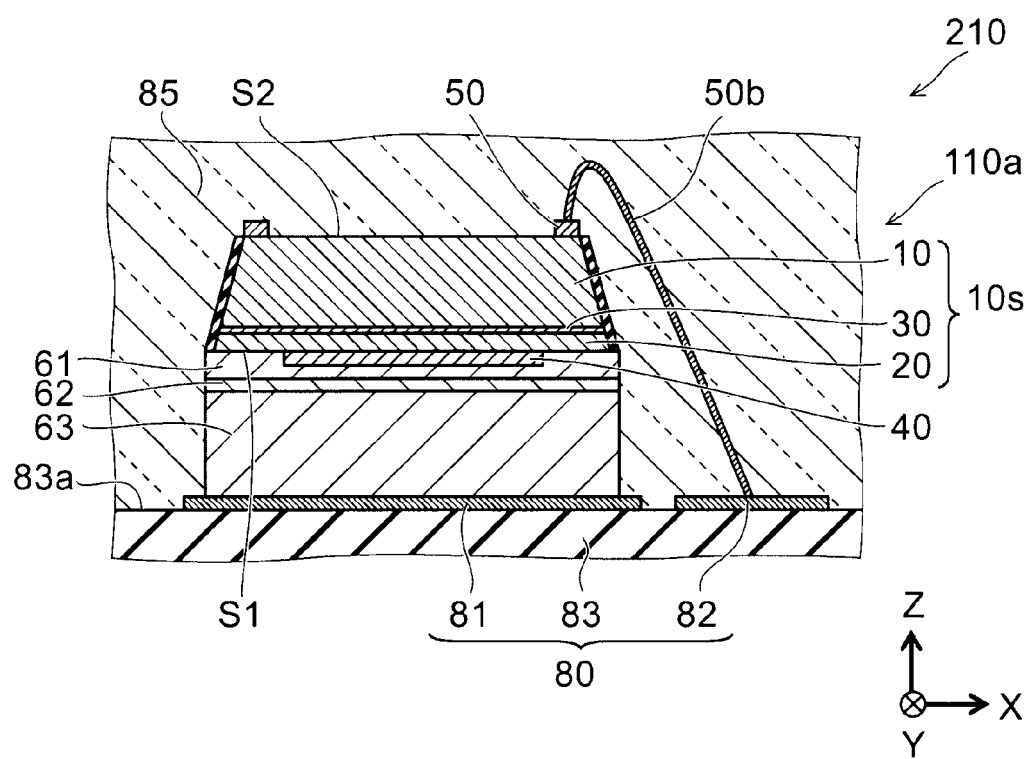
FIG. 14 is a schematic cross-sectional view showing the configuration of a light emitting apparatus according to a second embodiment.

FIG. 14 is a schematic cross-sectional view illustrating a configuration of a light emitting apparatus according to a second embodiment.

As shown in FIG. 14, a light emitting apparatus 210 according to the embodiment includes a semiconductor device according to the embodiment and a mounting component 80. In this example, while the semiconductor light emitting device 110a is used, any of the semiconductor light emitting devices according to the embodiment (e.g., semiconductor light emitting devices 110, 110a, 111 to 113, and the like) can be applied to the semiconductor light emitting device used in the light emitting apparatus 210.

The mounting component 80 includes a mounting substrate 83, a first substrate electrode 81, and a second substrate electrode 82. The mounting substrate 83 has a mounting surface 83a. The mounting surface 83a faces the first major surface S1 of the semiconductor light emitting device 110a. That is, in the semiconductor light emitting device 110a, the surface on the side of the first major surface S1 becomes a mounting surface.

The first substrate electrode 81 is provided on the mounting surface 83a. The first substrate electrode 81 is electrically connected to the p-side electrode 40. The second substrate electrode 82 is provided on the mounting surface 83a. The second substrate electrode 82 is electrically connected to the n-side electrode 50. For example, the second substrate electrode 82 is electrically connected to the n-side electrode 50 by a wiring 50b.

In the light emitting apparatus 210, a highly efficient light emitting apparatus is obtained.

In this example, the light emitting apparatus 210 further includes a wavelength conversion layer 85. The wavelength conversion layer 85 covers at least a part of the semiconductor light emitting device 110a. The wavelength conversion layer 85 absorbs a first light emitted from the light emitting layer 30 and emits a second light having a wavelength different from that of the first light. A fluorescent material layer is used for the wavelength conversion layer 85, for example. The wavelength conversion layer 85 can include plural fluorescent material layers. Optional light is emitted from the light emitting apparatus 210. The light emitted from the light emitting apparatus 210 is white light, for example.

According to the embodiment, highly efficient semiconductor light emitting device and light emitting apparatus are provided.

In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, the exemplary embodiments of the invention are described with reference to the specific examples. However, the invention is not limited to these specific examples. For example, one skilled in the art may similarly practice the invention by appropriately selecting specific configurations of components included in semiconductor light emitting devices such as electrodes, semiconductor layers, substrates, and bonding layers and components included in light emitting apparatuses such as mounting substrates, electrodes, wavelength conversion layers, etc. from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices and light emitting apparatuses practicable by an appropriate design modification by one skilled in the art based on the semiconductor light emitting devices and the light emitting apparatuses described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a p-type semiconductor layer including a nitride semiconductor and having a first major surface;
   an n-type semiconductor layer including a nitride semiconductor and having a second major surface;
   a light emitting layer provided between the n-type semiconductor layer and the p-type semiconductor layer, the first major surface being on a side of the p-type semiconductor layer opposite to the light emitting layer, the second major surface being on a side of the n-type semiconductor layer opposite to the light emitting layer;
   a p-side electrode contacting a part of the p-type semiconductor layer on the first major surface; and
   an n-side electrode contacting a part of the n-type semiconductor layer on the second major surface,
   the n-side electrode being provided outside and around the p-side electrode in a plan view along a direction from the p-type semiconductor layer to the n-type semiconductor layer, and
   a gap between the n-side electrode and the p-side electrode being larger than a thickness of the n-type semiconductor layer in the plan view.

2. The device according to claim 1, wherein
a gap between the n-side electrode and the p-side electrode is larger than a sum of a thickness of the n-type semiconductor layer, a thickness of the light emitting layer, and a thickness of the p-type semiconductor layer in the plan view.

3. The device according to claim 1, wherein
a gap between the n-side electrode and the p-side electrode is equal to or larger than five micrometers in the plan view.

4. The device according to claim 1, wherein
the n-side electrode surrounds a whole outer edge of the p-side electrode in the plan view.

5. The device according to claim 1, wherein
the n-side electrode surrounds a whole outer edge of the p-side electrode continuously in the plan view.

6. The device according to claim 1, wherein
the n-side electrode includes at least one selected from the group of Ti, Al, Rh, In, Ni, Pt and Au.

7. The device according to claim 1, wherein
a part of the p-side electrode contacting the p-type semiconductor layer includes Ni.

8. The device according to claim 1, further comprising a substrate.

9. The device according to claim 8, wherein
the p-side electrode includes a Ni film contacting a part of the p-type semiconductor layer and an Ag film provided between the Ni film and the substrate.

10. The device according to claim 8, further comprising a first bonding layer of metal provided between the substrate and the p-type semiconductor layer and between the substrate and the p-side electrode, covering the p-side electrode, contacting a part except the part of the p-type semiconductor layer on the first major surface, having a part outside the p-side electrode and overlapping with the n-side electrode in the plan view, having an electrical resistance between the first bonding layer and the p-type semiconductor layer higher than an electrical resistance between the p-side electrode and the p-type semiconductor layer, electrically contacting the substrate and the p-side electrode, and bonding the substrate with the p-side electrode and the p-type semiconductor layer.

11. The device according to claim 10, further comprising a second bonding layer of metal provided between the substrate and the first bonding layer, wherein
the second bonding layer is provided between the substrate and the p-type semiconductor layer and between the substrate and the p-side electrode.

12. The device according to claim 1, wherein
the first major surface is a mounting surface, and
the second major surface is a light extraction surface.

13. A light emitting apparatus, comprising:
a semiconductor light emitting device including:
a p-type semiconductor layer including a nitride semiconductor and having a first major surface;
an n-type semiconductor layer including a nitride semiconductor and having a second major surface;
a light emitting layer provided between the n-type semiconductor layer and the p-type semiconductor layer, the first major surface being on a side of the p-type semiconductor layer opposite to the light emitting layer, the second major surface being on a side of the n-type semiconductor layer opposite to the light emitting layer;
a p-side electrode contacting a part of the p-type semiconductor layer on the first major surface; and
an n-side electrode contacting a part of the n-type semiconductor layer on the second major surface, the n-side electrode being provided outside and around the p-side electrode in a plan view along a direction from the p-type semiconductor layer to the n-type semiconductor layer; and
a mounting component including:
a mounting substrate having a mounting surface facing the first major surface;
a first substrate electrode provided on the mounting surface and electrically connected to the p-side electrode; and
a second substrate electrode provided on the mounting surface and electrically connected to the n-side electrode,
a gap between the n-side electrode and the p-side electrode being larger than a thickness of the n-type semiconductor layer in the plan view.

14. The apparatus according to claim 13, further comprising
a wavelength conversion layer covering at least a part of the semiconductor light emitting device and configured to absorb a first light emitted from the light emitting layer to emit a second light having a wavelength different from a wavelength of the first light.

15. The apparatus according to claim 13, wherein
a gap between the n-side electrode and the p-side electrode is larger than a sum of a thickness of the n-type semiconductor layer, a thickness of the light emitting layer, and a thickness of the p-type semiconductor layer in the plan view.

16. The apparatus according to claim 13, wherein
a gap between the n-side electrode and the p-side electrode is equal to or larger than five micrometers in the plan view.

17. The apparatus according to claim 13, wherein
the n-side electrode surrounds a whole outer edge of the p-side electrode in the plan view.

18. The apparatus according to claim 13, wherein
the n-side electrode surrounds a whole outer edge of the p-side electrode continuously in the plan view.

19. The apparatus according to claim 13, wherein
the n-side electrode includes at least one selected from the group of Ti, Al, Rh, In, Ni, Pt and Au.

20. A semiconductor light emitting device, comprising:
a p-type semiconductor layer including a nitride semiconductor and having a first major surface;
an n-type semiconductor layer including a nitride semiconductor and having a second major surface;
a light emitting layer provided between the n-type semiconductor layer and the p-type semiconductor layer, the first major surface being on a side of the p-type semiconductor layer opposite to the light emitting layer, the second major surface being on a side of the n-type semiconductor layer opposite to the light emitting layer;
a p-side electrode contacting a part of the p-type semiconductor layer on the first major surface;
an n-side electrode contacting a part of the n-type semiconductor layer on the second major surface; and
a high resistance layer contacting the p-type semiconductor layer on the first major surface, having a part outside the p-side electrode in the plan view, and having an electrical resistance between the high resistance layer and the p-type semiconductor layer higher than an electrical resistance between the p-side electrode and the p-type semiconductor layer, the n-side electrode being provided outside and around the p-side electrode in a plan view along a direction from the p-type semiconductor layer to the n-type semiconductor layer.

21. The device according to claim 20, wherein
a part of the p-side electrode contacting the p-type semiconductor layer includes Ni, and
a part of the high resistance layer contacting the p-type semiconductor layer includes Ti.

22. The device according to claim 20, wherein
the p-side electrode is covered with the high resistance layer, and
the n-side electrode is overlapped with a part of the high resistance layer in the plan view.

23. A light emitting apparatus, comprising:
a semiconductor light emitting device including:
  a p-type semiconductor layer including a nitride semiconductor and having a first major surface;
  an n-type semiconductor layer including a nitride semiconductor and having a second major surface;
  a light emitting layer provided between the n-type semiconductor layer and the p-type semiconductor layer, the first major surface being on a side of the p-type semiconductor layer opposite to the light emitting layer, the second major surface being on a side of the n-type semiconductor layer opposite to the light emitting layer;
  a p-side electrode contacting a part of the p-type semiconductor layer on the first major surface;
  an n-side electrode contacting a part of the n-type semiconductor layer on the second major surface; and
  a high resistance layer contacting the p-type semiconductor layer on the first major surface, having a part outside the p-side electrode in the plan view, and having an electrical resistance between the high resistance layer and the p-type semiconductor layer higher than an electrical resistance between the p-side electrode and the p-type semiconductor layer,
  the n-side electrode being provided outside and around the p-side electrode in a plan view along a direction from the p-type semiconductor layer to the n-type semiconductor layer; and
a mounting component including:
  a mounting substrate having a mounting surface facing the first major surface;
  a first substrate electrode provided on the mounting surface and electrically connected to the p-side electrode; and
  a second substrate electrode provided on the mounting surface and electrically connected to the n-side electrode.

24. The apparatus according to claim 23, wherein
a part of the p-side electrode contacting the p-type semiconductor layer includes Ni, and
a part of the high resistance layer contacting the p-type semiconductor layer includes Ti.

25. The apparatus according to claim 23, wherein
the p-side electrode is covered with the high resistance layer, and
the n-side electrode is overlapped with a part of the high resistance layer in the plan view.

* * * * *